(12) United States Patent
Koyano et al.

(10) Patent No.: US 10,033,290 B2
(45) Date of Patent: Jul. 24, 2018

(54) POWER CONVERSION DEVICE

(75) Inventors: Hironori Koyano, Yamato (JP);
Takamasa Nakamura, Atsugi (JP);
Masao Saito, Tokyo (JP); Kouji Yamamoto, Chigasaki (JP); Tsutomu Matsukawa, Sagamihara (JP); Manabu Koshijo, Atsugi (JP); Junichi Itoh, Nagaoka (JP); Yoshiya Ohnuma, Nagaoka (JP)

(73) Assignees: NISSAN MOTOR CO., LTD., Yokohama-shi (JP); NAGAOKA UNIVERSITY OF TECHNOLOGY, Nagaoka-shi (JP)

( * ) Notice: Subject to any disclaimer, the term of this patent is extended or adjusted under 35 U.S.C. 154(b) by 0 days.

(21) Appl. No.: 14/122,397

(22) PCT Filed: May 7, 2012

(86) PCT No.: PCT/JP2012/061656
§ 371 (c)(1),
(2), (4) Date: Nov. 26, 2013

(87) PCT Pub. No.: WO2012/165101
PCT Pub. Date: Dec. 6, 2012

(65) Prior Publication Data
US 2014/0126263 A1 May 8, 2014

(30) Foreign Application Priority Data
May 31, 2011 (JP) .................................. 2011-122844

(51) Int. Cl.
*H02M 5/29* (2006.01)
*H02M 5/293* (2006.01)
(Continued)

(52) U.S. Cl.
CPC ............ *H02M 5/293* (2013.01); *H02M 7/003* (2013.01); *H05K 7/1432* (2013.01); *G01R 25/00* (2013.01);
(Continued)

(58) Field of Classification Search
CPC ........ H02M 5/14; H02M 7/003; H02M 5/293; H02M 2005/2932; H01F 30/14;
(Continued)

(56) References Cited

U.S. PATENT DOCUMENTS 4,363,065 A 12/1982 Hasegawa et al.
4,468,725 A 8/1984 Venturini
(Continued)

FOREIGN PATENT DOCUMENTS

EP 2 418 764 A2 2/2012
JP 1-231662 A 9/1989
(Continued)

OTHER PUBLICATIONS

U.S. Appl. No. 14/122,388, filed Nov. 26, 2013, Koyano et al.
(Continued)

*Primary Examiner* — Fred E Finch, III
*Assistant Examiner* — Rafael O De Leon Domenech
(74) *Attorney, Agent, or Firm* — Foley & Lardner LLP

(57) ABSTRACT

There is disclosed a power conversion apparatus 3 for converting polyphase ac power directly to ac power. A conversion circuit includes first switching devices 311, 313, 315 and second switching devices 312, 314, 316 connected, respectively, with the phases R, S, T of the polyphase ac power, and configured to enable electrical switching operation in both directions. There are provided input lines R, S, T connected with input terminals of the switching devices and output lines P, N connected with output terminals of the switching devices. The output terminals of the first switch-
(Continued)

ing devices and the output terminals of the second switching devices are, respectively, arranged in a row. The first switching devices and second switching devices are arranged side by side with respect to a direction of the rows. The output lines are disposed below the input lines in an up and down direction.

17 Claims, 13 Drawing Sheets

(51) Int. Cl.
*H02M 7/00* (2006.01)
*H05K 7/14* (2006.01)
*H02M 5/14* (2006.01)
*H01F 30/14* (2006.01)
*G01R 35/00* (2006.01)
*G01R 25/00* (2006.01)
*H02M 1/42* (2007.01)

(52) U.S. Cl.
CPC ............ *G01R 35/00* (2013.01); *G01R 35/005* (2013.01); *H01F 30/14* (2013.01); *H02M 1/4258* (2013.01); *H02M 5/14* (2013.01); *H02M 2005/2932* (2013.01); *Y02B 70/126* (2013.01)

(58) Field of Classification Search
CPC .... G01R 351/00; G01R 25/00; G01R 35/005; G01R 35/00
USPC .......................................... 361/611, 695, 91.7
See application file for complete search history.

(56) References Cited

U.S. PATENT DOCUMENTS

| | | | |
|---|---|---|---|
| 4,833,584 A | 5/1989 | Divan | |
| 5,010,471 A | 4/1991 | Klaassens et al. | |
| 5,132,896 A | 7/1992 | Nishizawa et al. | |
| 5,287,260 A | 2/1994 | Uchino | |
| 5,430,639 A | 7/1995 | Takahashi | |
| 5,517,063 A | 5/1996 | Schantz et al. | |
| 5,946,178 A | 8/1999 | Bijlenga | |
| 6,266,258 B1 | 7/2001 | Babinski | |
| 7,573,732 B2 | 8/2009 | Teichmann et al. | |
| 7,768,149 B2* | 8/2010 | Imai et al. ............ | 307/11 |
| 2001/0046143 A1 | 11/2001 | Bruckmann et al. | |
| 2002/0034087 A1 | 3/2002 | Suzuki et al. | |
| 2003/0174527 A1 | 9/2003 | Bruckmann et al. | |
| 2008/0013351 A1 | 1/2008 | Alexander | |
| 2008/0136265 A1 | 6/2008 | Mizukoshi et al. | |
| 2008/0205093 A1 | 8/2008 | Davies et al. | |
| 2008/0315819 A1 | 12/2008 | Ueda | |
| 2009/0015992 A1 | 1/2009 | Nohara et al. | |
| 2009/0251875 A1* | 10/2009 | Nagashima ............ | H01L 23/642 361/781 |
| 2011/0216561 A1* | 9/2011 | Bayerer ................ | H01L 25/162 363/71 |
| 2011/0267862 A1 | 11/2011 | Roesner et al. | |
| 2012/0019970 A1 | 1/2012 | Nagano et al. | |
| 2012/0139483 A1 | 6/2012 | Cottet | |
| 2013/0155731 A1 | 6/2013 | Reichard et al. | |

FOREIGN PATENT DOCUMENTS

| | | | |
|---|---|---|---|
| JP | 2-130955 A | | 5/1990 |
| JP | 3-145929 A | | 6/1991 |
| JP | 6-165524 A | | 6/1994 |
| JP | 6-261556 A | | 9/1994 |
| JP | 2001-045772 A | | 2/2001 |
| JP | 2002-252535 A | | 9/2002 |
| JP | 2005-065357 A | | 3/2005 |
| JP | 2005218205 | * | 8/2005 |
| JP | 2005-237138 A | | 9/2005 |
| JP | 2006-333590 A | | 12/2006 |
| JP | 2009-213269 A | | 9/2009 |
| JP | 2010-263702 A | | 11/2010 |
| RU | 2225026 C2 | | 2/2004 |
| WO | WO-00/08740 A2 | | 2/2000 |

OTHER PUBLICATIONS

U.S. Appl. No. 14/122,259, filed Nov. 26, 2013, Koyano et al.
U.S. Appl. No. 14/122,260, filed Nov. 26, 2013, Koyano et al.
U.S. Appl. No. 14/122,268, filed Nov. 26, 2013, Koyano et al.
U.S. Appl. No. 14/122,413, filed Nov. 26, 2013, Koyano et al.
USPTO Office Action, U.S. Appl. No. 14/122,259, dated Jun. 12, 2015, 11 pages.
USPTO Office Action, U.S. Appl. No. 14/122,260, dated Apr. 9, 2015, 9 pages.
European Extended Search Report, dated Oct. 27, 2015, 8 pages.
USPTO Office Action, U.S. Appl. No. 14/122,259, dated Oct. 8, 2015, 11 pages.
USPTO Office Action, U.S. Appl. No. 14/122,260, dated Oct. 22, 2015, 13 pages.
USPTO Office Action, U.S. Appl. No. 14/122,413, datd Sep. 29, 2015, 21 pages.
USPTO Office Action, U.S. Appl. No. 14/122,388, dated Jul. 20, 2015, 15 pages.
USPTO Notice of Allowance, U.S. Appl. No. 14/122,259 (2009/0052134, 2014/0085950, 2014/0085956, 2014/0104913, 2014/0126263, 2014/0192578, 2014/0247635, 2014/0247636, now U.S. Pat. Nos. 7,869,193, 8,031,479, 8,058,554, 8,500,491, 8,964,387), dated Apr. 12, 2016, 238 pages.
USPTO Office Action, U.S. Appl. No. 14/122,388, dated Jan. 15, 2016, 17 pages.
USPTO Office Action, U.S. Appl. No. 14/122,413, dated Feb. 4, 2016, 21 pages.
USPTO Office Action, U.S. Appl. No. 14/122,268, dated Mar. 4, 2016, 16 pages.
USPTO Office Action, U.S. Appl. No. 14/122,413, dated Jul. 21, 2016, 16 pages.
USPTO Office Action, U.S. Appl. No. 14/122,388, dated Sep. 29, 2016, 21 pages.
USPTO Advisory Action, U.S. Appl. No. 14/122,388, dated May 19, 2016, 10 pages.
USPTO Notice of Allowance, U.S. Appl. No. 14/122,268, dated Jul. 6, 2016, 7 pages.
USPTO Office Action, U.S. Appl. No. 14/122,260, dated Jun. 16, 2016, 14 pages.
USPTO Notice of Allowance, U.S. Appl. No. 14/122,388, dated May 4, 2017, 11 pages.
USPTO Notice of Allowance, U.S. Appl. No. 14/122,260, dated Jan. 5, 2017, 11 pages.
USPTO Notice of Allowance, U.S. Appl. No. 14/122,413, dated Nov. 23, 2016, 10 pages.

* cited by examiner

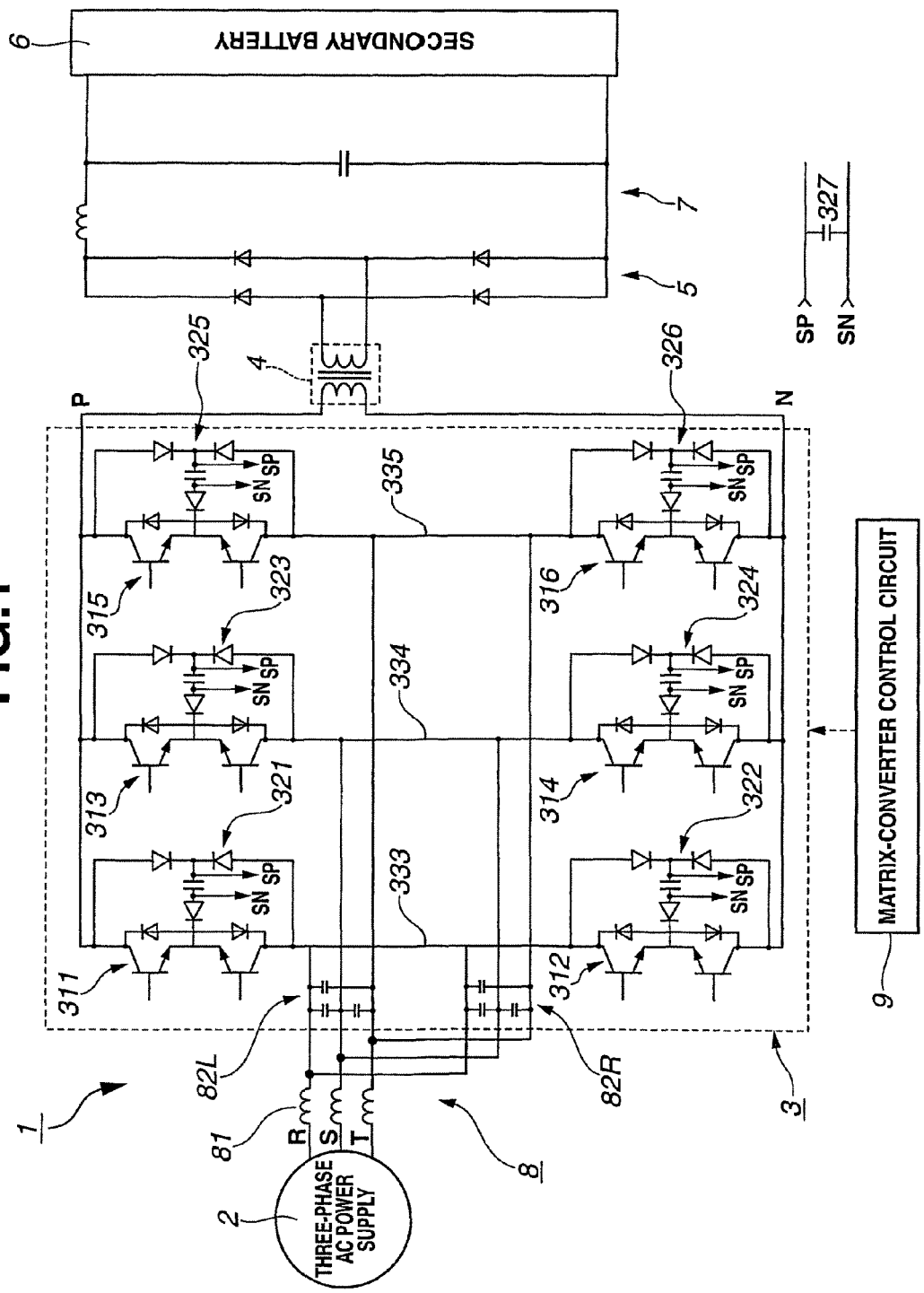

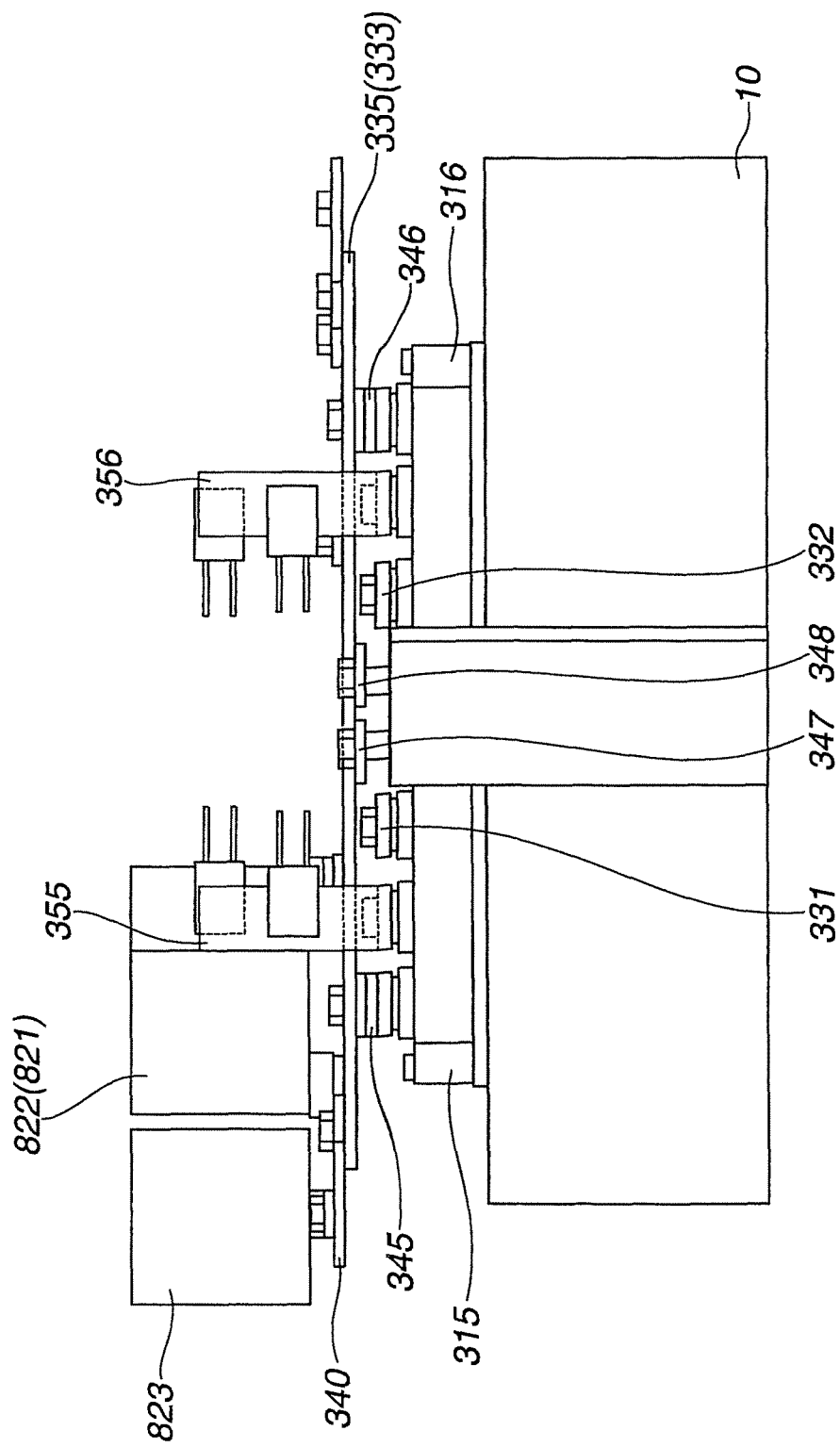

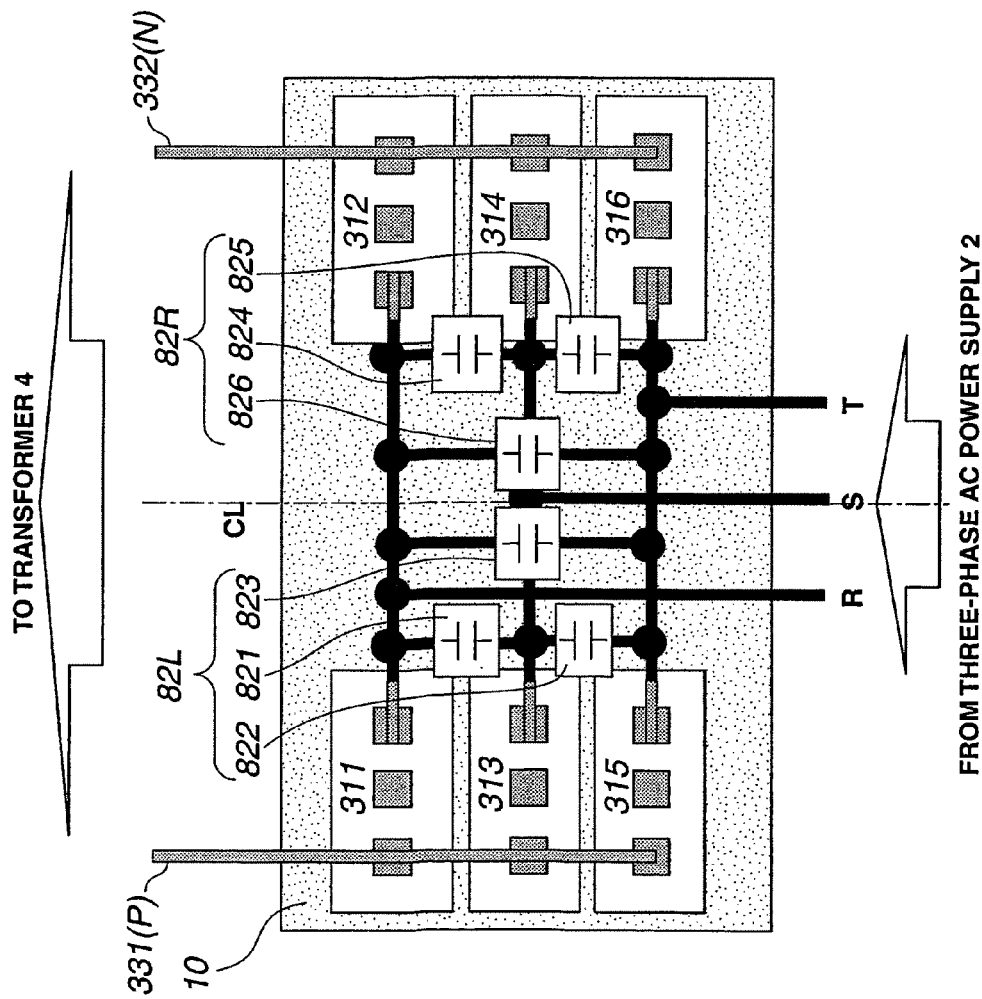

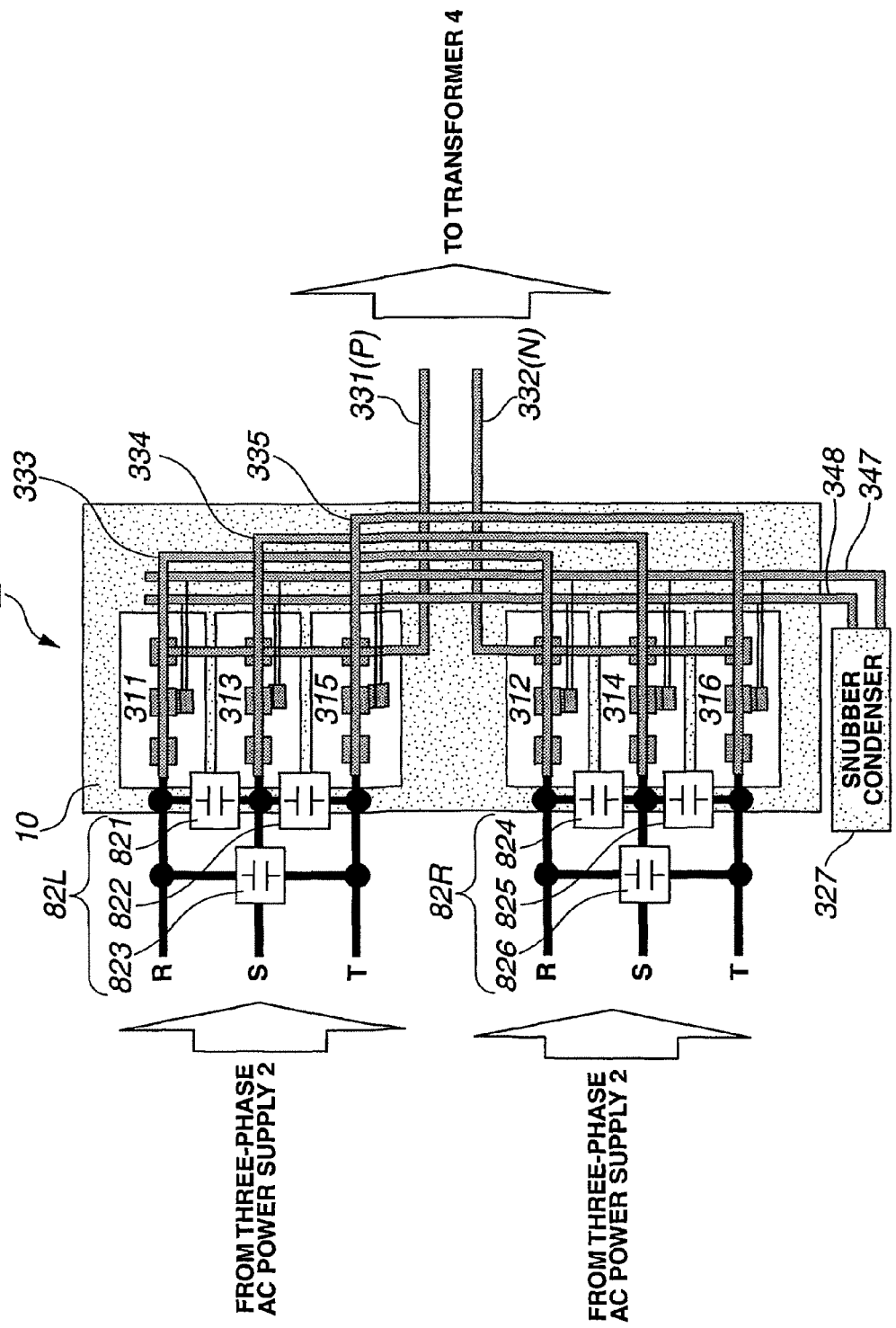

US 10,033,290 B2

POWER CONVERSION DEVICE

TECHNICAL FIELD

The present invention relates to a power conversion device or apparatus for converting ac power of utility frequency or commercial power frequency, directly into desired ac power.

BACKGROUND ART

There is known a matrix converter as a power conversion apparatus for converting ac power to ac power directly and efficiently with a construction requiring a smaller number of component parts and enabling size reduction of the apparatus (Patent Document 1).

However, an output line is long in the above-mentioned matrix converter of earlier technology in which a plurality of IGBTs (Insulated Gate Bipolar Transistors) are disposed in an inline arrangement, and the output line is connected collectively from each IGBT. Especially, in a power conversion apparatus in which high frequency ac current flows through the output line, the apparatus becomes susceptible to the influence of L component if the length of a wiring is great.

PRIOR ART LITERATURE

Patent Document(s)

Patent Document 1: W2006-333590 A

SUMMARY OF THE INVENTION

It is an object of the present invention to provide power conversion device or apparatus for reducing a length of an output line.

According to the present invention, a plurality of switching devices forming a power conversion circuit are arranged so that an output line is located below an input line in an up and down direction.

According to the present invention, the switching devices are arranged and the output line is placed below the input line, so that it is possible to reduce the length of the output line.

BRIEF DESCRIPTION OF THE DRAWINGS

FIG. 1 is an electric circuit diagram showing a power conversion system to which one embodiment of the present invention is applied.

FIG. 2D is a side view showing the power conversion apparatus according to the embodiment of the present invention, in an intermediate state under the assembly process.

FIG. 4A is a plan view showing another layout of the IGBTs and filter condensers shown in FIG. 3.

FIG. 5 is a view showing still another layout of the IGBTs and filter condensers shown in FIG. 3, in a plan view.

MODE(S) FOR CARRYING OUT THE INVENTION

<<Outline of Power Conversion System 1>>

Figure 2A:
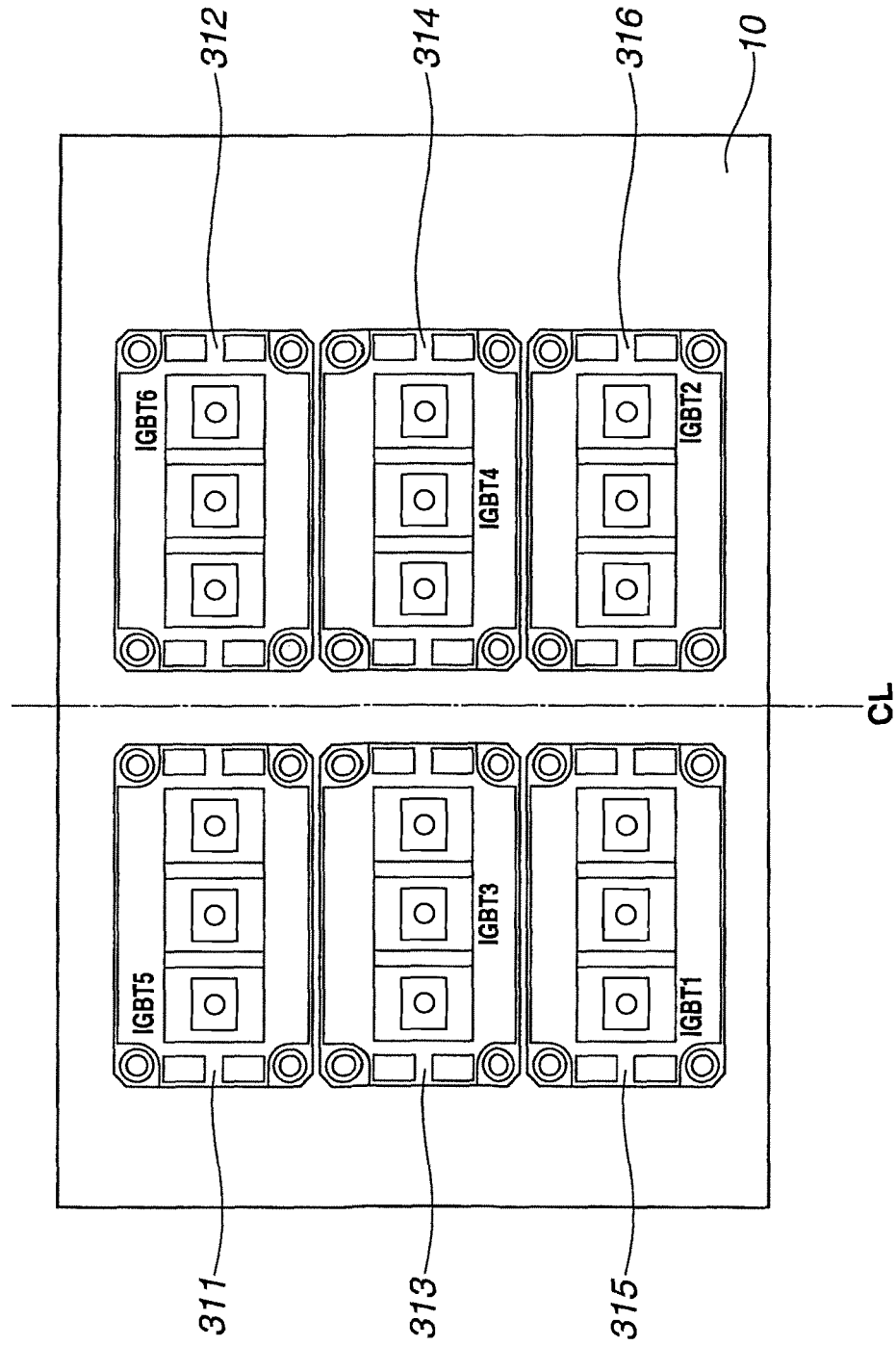
FIG. 2A is a plan view showing a power conversion apparatus according to the embodiment of the present invention, in an intermediate state under an assembly process.

First, FIG. 1 is used for illustrating the outline of a power conversion system to which an embodiment of the present invention is applied. A power conversion system 1 of this example is a system to convert three-phase ac power supplied from a three-phase ac power supply or power source 2, directly to single-phase ac power, with a power conversion apparatus or device 3 according to the embodiment of the present invention, to step up or down the single-phase ac power to an appropriate voltage with a transformer 4, and thereafter to convert the ac power to dc power with a rectifier 5, and thereby to charge a secondary battery 6. There is further provided a smoothing circuit 7.

A filter circuit 8 is provided, in power conversion system 1 of this example, for attenuating higher harmonics for noise suppression for each phase of output lines (R phase, S phase and T phase) to supply the three-phase ac power from three-phase ac power supply or source 2. Filter circuit 8 of this example includes three filter reactors 81 connected with the three phases R, S and T, respectively, and six filter condensers or capacitors 82L, 82R connected among the three phases R, S and T. A layout of filter condensers 82L, 82R (shown in FIGS. 3~6, as filter condensers 821~836) is explained later.

In the power conversion system of this example, the three-phase ac power is supplied through filter circuit 8, to power conversion apparatus 3, and converted to the signal-phase ac power. Power conversion apparatus 3 of this example includes 6 bidirectional switching devices 31 arranged in a matrix corresponding to the R, S and T phases. Hereinafter, a reference numeral 31 is used, as a generic term, to denote one of the bidirectional switching devices generally, and reference numerals 311~316 are used to denote a specific one of the six bidirectional switching devices, as shown in FIG. 1.

Each of the bidirectional switching devices 31 of this example is an IGBT module including a semiconductor switching element in the form of an IGBT (Insulated Gate Bipolar Transistor), and an anti-parallel freewheel diode or flyback diode combined in an anti-parallel connection. The construction of each bidirectional switching device 31 is not limited to the construction shown in the figure. For example, it is optional to employ a construction including two reverse blocking IGBT elements in the anti-parallel connection.

A snubber circuit 32 is provided for each of bidirectional switching devices 31, to protect the corresponding bidirectional switching device 31 from surge voltage generated with ON/OFF operation of the bidirectional switching device 31. Snubber circuit 32 is connected with the input side and the output side of the corresponding bidirectional switching device 31 and formed by a combination of one snubber condenser or capacitor and three diodes. Hereinafter, a reference numeral 32 is used, as a generic term, to denote one of the snubber circuits generally, and reference numerals 321~326 are used to denote a specific one of the six snubber circuits, as shown in FIG. 1.

A matrix converter control circuit 9 is provided, in the power conversion system 1 of this example, for ON/OFF control of each of bidirectional switching devices 31 of power conversion apparatus 3. Matrix converter control circuit 9 receives, as inputs, a value of a voltage supplied from three-phase ac power supply 2, a value of a dc current currently being outputted, and a value of a target current command, controls the gate signal of each of bidirectional switching devices 31 in accordance with these inputs, adjusts the single-phase ac power outputted to transformer 4, and thereby obtains the dc power corresponding to a target.

Transformer 4 increases or decreases the voltage of single-phase ac power obtained by conversion of power conversion apparatus 3, to a predetermined value. Rectifier 5 includes four rectifying diodes and converse the single-phase ac power of the adjusted voltage into dc power. Smoothing circuit 7 includes a coil and a condenser or capacitor and smooths pulsation included in the dc current obtained by the rectification, into a condition closer to the dc current.

The thus-constructed power conversion system 1 of this example converts the three-phase ac power supplied from three-phase power supply 2, directly into the single-phase ac power with power conversion apparatus 3, and converse the single-phase ac power into the dc power after the adjustment to a desired voltage. Thus, secondary battery 6 is charged. The power conversion system 1 is merely one example to which the power conversion apparatus 3 according to the present invention is applied. The present invention is not limited to this example in which the present invention is applied to the power conversion system 1. The present invention is applicable to other power conversion systems when at least one of the power before conversion and the power after conversion is polyphase ac power.

<<Layout of Parts of Power Conversion Apparatus 3>>

FIGS. 2~6 are views for illustrating the spatial layout or arrangement of parts constituting power conversion apparatus 3 shown in FIG. 1. In these figures, the same reference numerals are used for identical parts shown in FIG. 1 to show the correspondence in the figures.

Figure 2B:
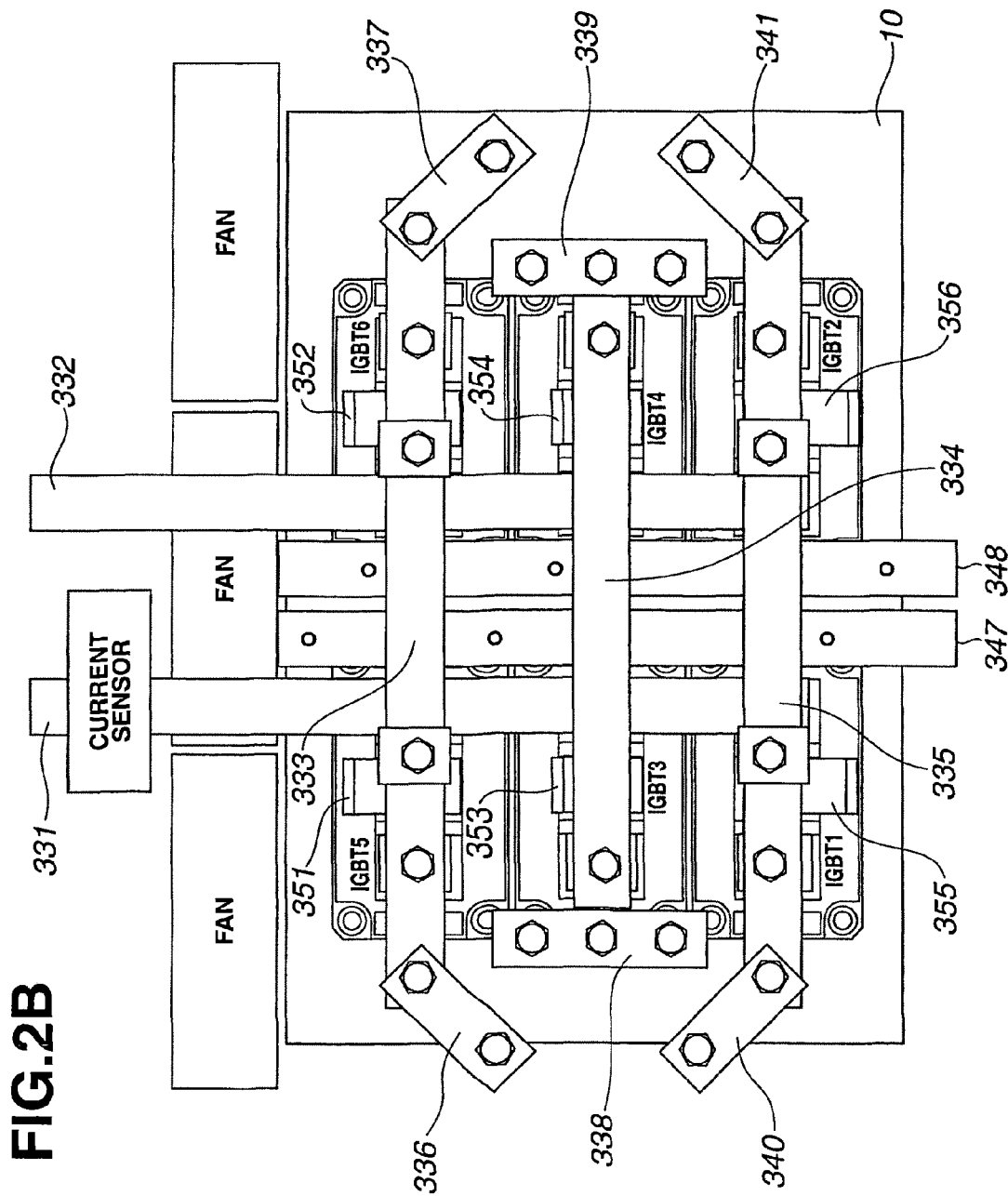
FIG. 2B is a plan view showing the power conversion apparatus according to the embodiment of the present invention, in an intermediate state under the assembly process.
Figure 2C:
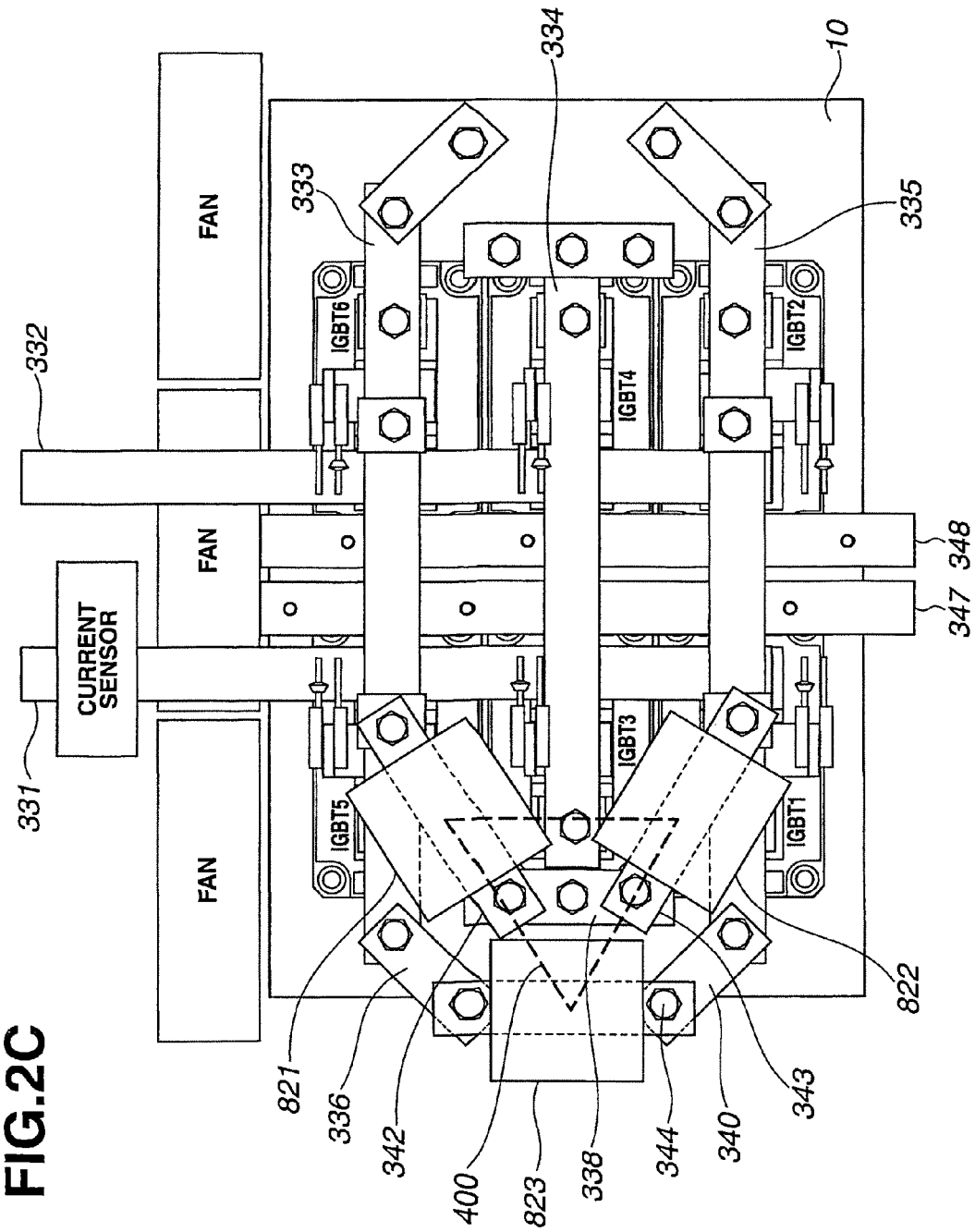
FIG. 2C is a plan view showing the power conversion apparatus according to the embodiment of the present invention, in an intermediate state under the assembly process.

FIG. 2 includes FIGS. 2A~2D. FIG. 2A is a plan view showing an intermediate state during the assembly process, in which the six bidirectional switching devices 31 (also referred to as the IGBT modules) are mounted on an upper surface of a heat sink 10. FIG. 2B is a plan view showing an intermediate state during the assembly process, in which busbars are further mounted, for connecting terminals of the bidirectional switching devices 31. FIG. 2C is a plan view showing an intermediate state during the assembly process, in which, of the three diodes forming the snubber circuit 32, and the filter condensers 82 of filter circuit, the left side three filter condensers are mounted. FIG. 2D is a side view showing the intermediate state during the assembly process. Since constituent parts of power conversion apparatus 3 of this example are overlapped in the plan view, in the following explanation, main portions are shown in another drawing.

Figure 3:
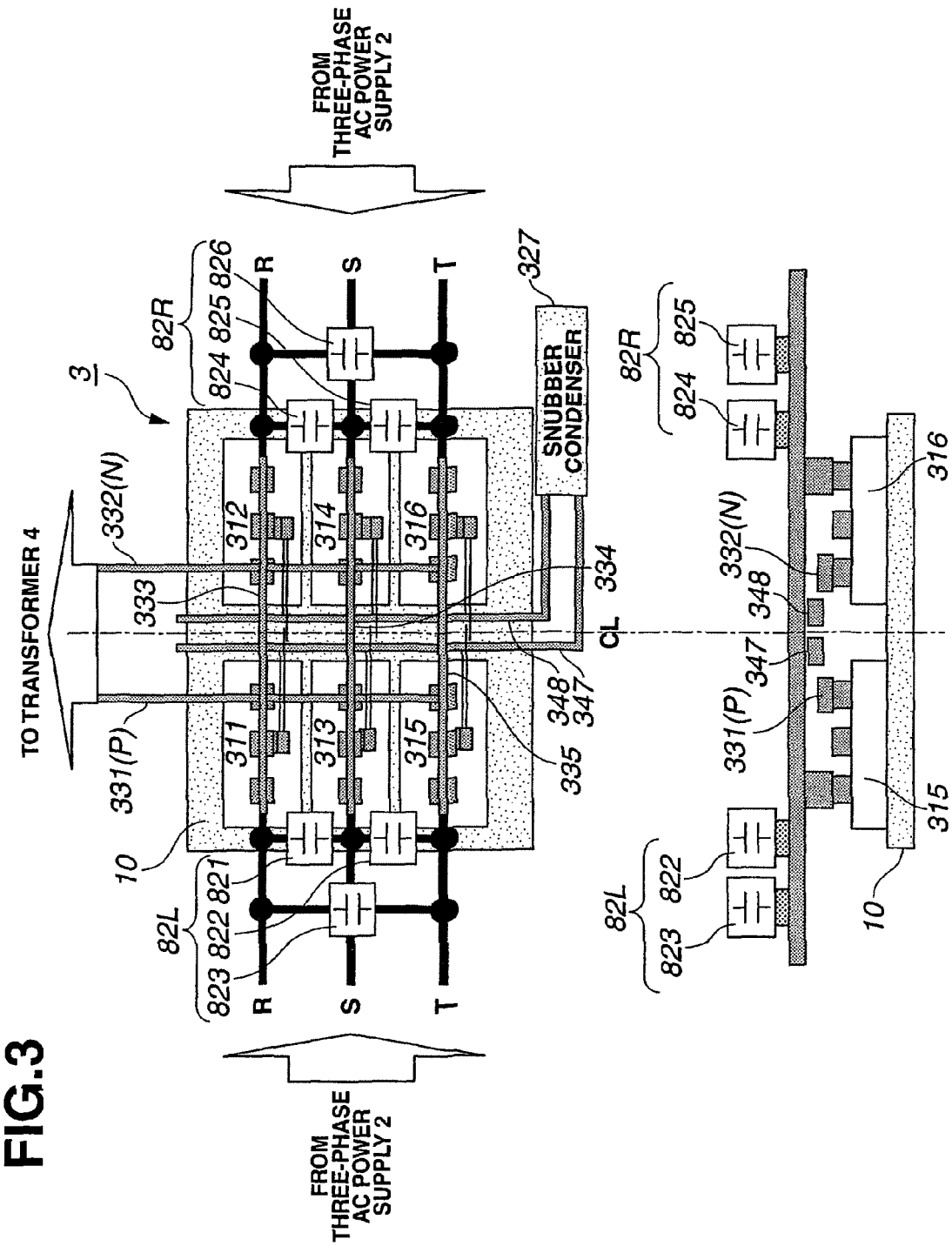
FIG. 3 is a view showing a layout of IGBTs and filter condensers of the power conversion apparatus shown in FIG. 2, in a plan view and a side view.

As shown in FIG. 2 and FIG. 3, each bidirectional switching device 31 of this example includes an input terminal, an output terminal and an intermediate or midpoint terminal between the two IGBTs arranged in a pair, and the inpute terminal, output terminal and intermediate terminal are provided on the upper side of the module package. Among the six bidirectional switching devices 311~316 shown in FIG. 3, the left side terminals of the three left side bidirectional switching devices 311, 313 and 315 are input terminals, the right side terminals of the three left side bidirectional switching devices 311, 313 and 315 are output terminals, and the central terminals of the three left side bidirectional switching devices 311, 313 and 315 are intermediate terminals. Among the six bidirectional switching devices 311~316 shown in FIG. 3, the right side terminals of the three right side bidirectional switching devices 312, 314 and 316 are input terminals, the left side terminals of the three right side bidirectional switching devices 312, 314 and 316 are output terminals, and the central terminals of the three right side bidirectional switching devices 312, 314 and 316 are intermediate terminals. Gate terminals of bidirectional switching devices 31 are provided in another part of the module package and omitted in the figure.

As shown in FIG. 2 and FIG. 3, the six bidirectional switching devices 311~316 are fixed on the upper surface of heat sink 10, by fastening means such as bolts. As shown in these figures, the six bidirectional switching devices 311~316 are arranged in three pairs: a first pair of bidirectional switching devices 311 and 312 disposed, respectively, on the left and right sides of a center line CL, a second pair of bidirectional switching devices 313 and 314 disposed, respectively, on the left and right sides of the center line CL, and a third pair of bidirectional switching devices 315 and 316 disposed, respectively, on the left and right sides of the center line CL. In other words, the bidirectional switching devices 311 and 312 are disposed side by side, on the left and right side of center line CL, respectively, along the extending direction in which the three terminals (input terminal, output terminal and intermediate terminals) of each bidirectional switching device 31 are extended or arranged; the bidirectional switching devices 313 and 314 are disposed side by side, on the left and right side of center line CL, respectively, along the extending direction; and the bidirectional switching devices 315 and 316 are disposed side by side, on the left and right side of center line CL, respectively, along the extending direction. Hereinafter, this arrangement is also expressed as "juxtaposition, or parallel arrangement, with respect to center line CL or output lines P, N connecting the output terminals". This arrangement is different from the arrangement shown in FIG. 5. The paired bidirectional switching devices are two bidirectional switching devices connected with the same one of the R, S, T phases of the input line.

With this arrangement or juxtaposition including the bidirectional switching devices 311 and 312; 313 and 314; or 315 and 316 of each pair disposed on the left and right sides of center line CL, it is possible to employ a layout to draw out the output lines P and N (busbars 331 and 332) in one direction at a minimum distance. Since influence of L component is increased by an increase of wiring outputting high frequency ac power, the arrangement of this example can restrain the influence of the L component. This effect of the arrangement of this example is more advantageous as compared to the example shown in FIG. 5. Thus, the output lines P and N are almost straight up to transformer 4.

As mentioned before, the right end terminals of left side bidirectional switching devices 311, 313 and 315 on the left side of center line CL are all output terminals, and the left end terminals of left side bidirectional switching devices 311, 313 and 315 are all input terminals. The left end terminals of right side bidirectional switching devices 312, 314 and 316 on the right side of center line CL are all output terminals, and the right end terminals of right side bidirectional switching devices 312, 314 and 316 are all input terminals.

To the input terminals at the left ends of bidirectional switching devices 311, 313 and 315 on the left side of center line CL, the input lines R, S and T of one branch branching off from the input lines of three-phase ac power supply 2 are connected in an inward direction toward the center line CL. To the input terminals at the right end of bidirectional switching devices 312, 314 and 316 on the right side of center line CL, the input lines R, S and T of the other branch branching off from the input lines of three-phase ac power supply 2 are connected in an inward direction toward the center line CL. The R phase is connected to the input terminals of bidirectional switching devices 311 and 312; the S phase is connected to the input terminals of bidirectional switching devices 313 and 314; and the T phase is connected to the input terminals of bidirectional switching devices 315 and 316. The input lines R, S and T on the left side are extended and connected in the inward direction toward center line CL, and the input lines R, S and T on the right side are also extended and connected in the inward direction toward center line CL. With this connecting arrangement of the input lines, it is possible to decreases the distance in the left and right direction, of heat sink 10 as compared to the arrangement in the other example shown in FIG. 6.

In the configuration of FIG. 1, the input lines R, S and T extending from three-phase ac power supply 2 to power conversion apparatus 3 branch off at the position between the filter reactors 81 and the filter condensers 82L and 82R. However, it is possible to employ a configuration in which the input lines R, S and T are divided into two branches on the upstream side of filter reactors 81, and the filter reactors 81 are provided for each of the branches of the input lines R, S and T.

A busbar 331 forming an output line P of power conversion apparatus 3 is connected with the right end output terminals of bidirectional switching devices 311, 313 and 315 on the left side of center line CL. A busbar 332 forming an output line N of power conversion apparatus 3 is connected with the left end output terminals of bidirectional switching devices 312, 314 and 316 on the right side of center line CL. The forward ends of the busbars 331 and 332 are connected with transformer 4. Busbars including these busbars 331 and 332 and busbars mentioned herein below are made of conductor such as copper, superior in the electrical conductivity.

A busbar 333 connects the input terminals of bidirectional switching devices 311 and 312 paired with each other and disposed on the left and right sides of center line CL. A busbar 334 connects the input terminals of bidirectional switching devices 313 and 314 paired with each other and disposed on the left and right sides of center line CL. A busbar 335 connects the input terminals of bidirectional switching devices 315 and 316 paired with each other and disposed on the left and right sides of center line CL. In the equivalent circuit shown in FIG. 1, the wirings corresponding to the busbars are shown with the same reference numerals, respectively. These busbars 333~335 are not essential for the function of power conversion apparatus 3, and therefore, it is optional to omit these busbars.

These busbars 333~335 are arranged to intersect the busbars 331 and 332 forming the output lines P and N as viewed in a plan view. However, as shown in the side view of FIG. 3, the busbars 333~335 connecting the input terminals are formed at a position higher than the busbars 331 and 332, and thereby arranged to avoid interference therebetween with a multilevel crossing structure of overpass or underpass.

The filter condensers 82L and 82R provided between two of the phases can be used in common by employing the arrangement in which the bidirectional switching devices 311 and 322 disposed on the left and right sides of center line CL in the first pair are connected, the bidirectional switching devices 313 and 324 in the second pair are connected, and the bidirectional switching devices 315 and 326 in the third pair are connected. Specifically, filter condenser 821 is provided between the R and S phases on the left side in FIG. 3, and filter condenser 824 is provided between the R and S phases on the right side in FIG. 3. The busbar 333 connects the input terminals of bidirectional switching devices 311 and 312 to which the R phase is inputted. Therefore, noises in the R phase of three-phase ac power supply 2 are removed by cooperative filtering operation of the two filter condensers 821 and 824. Consequently, it is possible to reduce the capacity of one filter condenser and hence to reduce the sizes of the filter condensers. The same is applied to the S phase and the T phase.

The filter circuit in this example includes the six filter condensers 821~826 so arranged that three of the six filter condensers are connected among the input lines on the left side of center line CL and the remaining three are connected among the input lines on the right side of center line CL, as shown in FIG. 3. The left side filter condenser 821 is provided between the S phase and the R phase which corresponds to the input terminal of bidirectional switching device 311. Similarly, the left side filter condenser 822 is provided between the T phase and the S phase which corresponds to the input terminal of bidirectional switching device 313. The left side filter condenser 823 is provided between the R phase and the T phase which corresponds to the input terminal of bidirectional switching device 315. Similarly, the right side filter condenser 824 is provided between the S phase and the R phase corresponding to the input terminal of bidirectional switching device 313. The right side filter condenser 825 is provided between the T phase and the S phase corresponding to the input terminal of bidirectional switching device 314. The right side filter condenser 826 is provided between the R phase and the T phase corresponding to the input terminal of bidirectional switching device 316.

With the arrangement in which the six filter condensers 821~826 are arranged so that three are on the left side of center line CL and the other three filter condensers are on the right side, for the six bidirectional switching devices 311~316 arranged so that three are on the left side of center line CL and the other three switching devices are on the right side, it is possible to reduce the distance or length of connection wire routing for each of filter condensers 821~826 and bidirectional switching devices 311~316.

In this example, the left three and the right three of filter condensers 821~826 are disposed on the outer sides of the region in which the six bidirectional switching devices 311~316 are formed, with respect to center line CL. Concretely, as shown in FIG. 2D, the left three and the right three of filter condensers 821~826 are fixed on upper part of the busbars. With the arrangement in which filter condensers 821~826 are so arranged that the bidirectional switching devices 311~316 are located between the left three filter condensers and the right three filter condensers, it is possible to minimize the spacing between the left and right bidirectional switching devices 31L and 31R in the left and right direction. Therefore, it is possible to set the distance or length in the left and right direction, of heat sink 10 at a minimum value. As a result, it is possible to reduce the size of heat sink 10 as compared to the arrangement in another example shown in FIG. 4A.

The left three and the right three of filer condensers 821~826 are mounted on the left and right sides of center line CL as shown in FIG. 2 showing the plan view and side view of an actual apparatus.

Beforehand, the explanation is directed to the connection structure of the busbars. As shown in FIG. 2B, busbar 331 forms the output line P connecting the output terminals of bidirectional switching devices 311, 313 and 315 and leading to transformer 4. Busbar 332 forms the output line N connecting the output terminals of bidirectional switching devices 312, 314 and 316 and leading to transformer 4. Busbar 333 is a busbar connecting the input terminals of bidirectional switching devices 311 and 312, and including a first end portion which extends outwards in a leftward direction beyond the input terminal of bidirectional switching device 311 and which is connected with a busbar 336 to connect the filter condenser 823, and a second end portion which extends outwards in a rightward direction beyond the input terminal of bidirectional switching device 312 and which is connected with a busbar 337 to connect the filter condenser 826 (cf. FIG. 2C and FIG. 3 for the connection state of filter condensers 823 and 826). Busbars 336 and 337 connected with both ends of busbar 333 are inclined with respect to a line connecting the input terminals of bidirectional switching devices 311, 313 and 315, that is a line extending in an up and down direction as viewed in FIG. 2C.

Busbar 334 is a busbar connecting the input terminals of bidirectional switching devices 313 and 314, and including a first end portion which extends outwards in the leftward direction beyond the input terminal of bidirectional switching device 313 and which is connected with a busbar 338 to connect the filter condensers 821 and 822, and a second end portion which extends outwards in the rightward direction beyond the input terminal of bidirectional switching device 314 and which is connected with a busbar 339 to connect the filter condensers 824 and 825 (cf. FIG. 2C and FIG. 3 for the connection state of filter condensers 821, 822, 824 and 825). Busbars 338 and 339 connected with both ends of busbar 334 extend along the line connecting the input terminals of bidirectional switching devices 311, 313 and 315, that is the line extending in the up and down direction as viewed in a left upper view(FIG. 2C?) of FIG. 2.

Busbar 335 is a busbar connecting the input terminals of bidirectional switching devices 315 and 316, and including a first end portion which extends outwards in the leftward direction beyond the input terminal of bidirectional switching device 315 and which is connected with a busbar 340 to connect the filter condenser 823, and a second end portion which extends outwards in the rightward direction beyond the input terminal of bidirectional switching device 316 and which is connected with a busbar 341 to connect the filter condenser 826 (cf. FIG. 2C and FIG. 3 for the connection state of filter condensers 823 and 826). Busbars 340 and 341 connected with both ends of busbar 335 are inclined with respect to the line connecting the input terminals of bidirectional switching devices 311, 313 and 315, that is the line extending in the up and down direction as viewed in FIG. 2C.

As shown in FIG. 2D, these busbars 333, 334 and 335 are connected with the input terminals of bidirectional switching devices 311~316 through a plurality of busbars 345 and 346, and disposed at a position or level above the busbars 331 and 332 forming the output lines P and N. With this arrangement, the busbars 333~335 and the busbars 331 and 332 are separated in the height or vertical direction with a predetermined clearance without interference in the manner of grade separation or multilevel crossing.

As shown by broken lines in FIG. 2C, filter condensers 821, 822 and 823 are disposed on the outer side with respect to center line CL, and arranged so that the centers of filter condensers 821, 822 and 823 are located, respectively, at the apexes of a triangle (preferably an isosceles triangle or an equilateral or regular triangle) which is oriented so that one of the apexes is directed in the outward direction. With the arrangement of the three filter condensers 821, 822 and 823 located at the apexes of the triangle, it is possible to set the wiring lengths among the condensers at minimum distances, to reduce the size of power conversion apparatus 3, and to attain tuning among the condensers properly. Furthermore, with the arrangement in which the triangle is so oriented that one of the apexes of the triangle is directed in the outward direction, it is possible to improve the balance of wiring connecting to the condensers and to decrease the distance to each of the busbars 333, 334 and 335, as compared to the arrangement in which one of the apexes of the triangle is directed in the inward direction, Filter condenser 821 connected between the R phase and S phase is mounted on the upper surface of a busbar 342. Filter condenser 822 connected between the S phase and T phase is mounted on the upper surface of a busbar 343. These two busbars 342 and 343 are inclined with respect to a line connecting the input terminals of bidirectional switching devices 311, 313 and 315, that is, a line extending in the up and down direction in FIG. 2C. Moreover, these two busbars 342 and 343 are extended across the line connecting the input terminals of bidirectional switching devices 311, 313 and 315, that is, the line extending in the up and down direction in FIG. 2C, and connected with busbars 333, 342 and 335. Filter condensers 824 and 825 on the right side of center line CL are arranged symmetrically with respect to center line CL.

With the arrangement in which busbars 342 and 343 are inclined with respect to the line connecting the input terminals of bidirectional switching devices 311, 313 and 315, it is possible to make the wiring distance equal to the wiring distance of the filter condenser 823 connected between the R phase and T phase, as much as possible. Therefore, it is possible to attain tuning among filter condensers 821, 822 and 823. Moreover, with the arrangement in which busbars 342 and 343 are provided across the line connecting the input terminals of bidirectional switching devices 311, 313 and 315, it is possible to reduce the connection distances of filter condensers 821 and 822 with busbars 333, 334 and 335, and hence it is possible to reduce the size of power conversion apparatus 3. With the arrangement in which each of the filter condensers 821~826 is disposed on the upper surface of the busbars, namely the arrangement in which the bidirectional switching devices 311~316 are disposed on one side of the busbars, and the filter condensers 821~826 are on the opposite side of the busbars, the design freedom or flexibility of layout of filter condensers 821~826 is increased.

Filter condenser 823 connected between the R phase and T phase is mounted on the upper surface of a busbar 344 connected between busbars 336 and 340. This busbar 344 is disposed so that busbar 344 is parallel to the line connecting the input terminals of bidirectional switching devices 311, 313 and 315.

Following is explanation on an implementing example of three diodes and one snubber condenser or capacitor forming one of the snubber circuits 32 shown in FIG. 1. In the case of the snubber circuit 321 of bidirectional switching device 311, for example, as shown in FIG. 1, a first terminal of snubber circuit 321 is connected with the input terminal of bidirectional switching device 311, a second terminal of snubber circuit 321 is connected with the intermediate terminal of bidirectional switching device 311, and a third terminal is connected with the output terminal of bidirectional switching device 311. Therefore, as shown in FIGS. 2C and 2D, the three diodes are fixed and connected, respectively, with brackets 351~356 which are made of conductor and connected with the intermediate terminals of bidirectional switching devices 31L and 31R. FIG. 2D shows only the bracket 355.

In this example, the conversion system uses a relatively large sized electrolytic condenser for the snubber condensers, and employs a snubber condenser 327 common to the six snubber circuits 321~326 (cf. FIG. 3). Busbars 347 and 348 for connecting this snubber condenser 327 and the three diodes are formed to extend, between the busbars 331 and 332 forming the output lines P and N, in the same direction as the output lines.

As shown in FIG. 2D and FIG. 3, the two busbars 347 and 348 connected with snubber condenser 327 are fixed at a level higher than the busbars 331 and 332 forming the output lines P and N, and lower than the busbars 333, 334 and 335. These two busbars 347 and 348 are supported by heat sink 10 or a base (not shown) other than heat sink 10. It is optional to provide insulating coating on the surfaces of busbars 347 and 348 to prevent short-circuit with busbars 333, 334 and 335.

As to the layout of busbar 311 and 312 forming output lines P and N and busbars 347 and 348 leading to snubber condenser 327, the disposition of busbars 347 and 348 between busbars 311 and 312 makes it possible to reduces the wiring distances of output lines P and N and the wiring distances to snubber condenser 327. Moreover, the setting of busbars 347 and 348 at the position higher than busbar 311 and 312 makes it possible to reduce the distances from the diodes of snubber circuits 321~326.

According to this embodiment, it is possible to provide following advantages.

1) To the six bidirectional switching devices 311~316, three devices being on one of the left and right sides of center line CL, and the other three devices being on the other side, the six filter condensers 821~826 are disposed so that three of the six filter condensers are disposed on the left side of center line CL to the three devices on the left side, and the remaining three filter condensers are disposed on the right side of center line CL to the right three bidirectional switching devices. Therefore, it is possible to reduce the routing or wiring distances of filter condensers 821~826 and bidirectional switching devices 311~316.

2) In this example, the pair of bidirectional switching devices 311 and 312, the pair of bidirectional switching devices 313 and 314, and the pair of bidirectional switching devices 315 and 316 are arranged so that the two devices of each pair are arranged side by side on the left and right sides of center line CL, respectively. Moreover, the busbars 331 and 332 forming output lines P and N are located, in the up and down direction (the height direction), below the input lines R, S and T, and the busbars 333, 334 and 335. This layout makes it possible to draw out the output lines P and N (busbars 331 and 332) in one direction shortly without interference. Therefore, the layout of this example can restrain the influence of the L component or inductance though a longer wire for outputting high frequency ac power would be susceptible to the influence of the L component.

3) In this example, the three of filter condensers 821~826 on the left side and the other three filter condensers on the right side are disposed on the outer sides of the region in which the six bidirectional switching devices 311~316 are provided, with respect to center line CL so that the region of the bidirectional switching devices is located between the three filter condensers on the left side and the other three filter condensers on the right side. Therefore, it is possible to minimize the spacing, in the left and right direction, between the left side bidirectional switching devices 31L and the right side bidirectional switching devices 31R. Consequently, it is possible to set the distance or dimension of heat sink 10 in the left and right direction at a minimum distance, and hence to reduce the size of heat sink 10.

4) In this example, busbars 333, 334 and 335 connect the input terminals of bidirectional switching devices 311 and 312 arranged on the left and right side of center line CL in a pair, the input terminals of bidirectional switching devices 313 and 314 arranged on the left and right side of center line CL in a pair, and the input terminals of bidirectional switching devices 315 and 316 arranged on the left and right side of center line CL in a pair, respectively. Therefore, filter condensers 82L and 82R provided between the phases can be utilized for common use. Consequently, it is possible to reduce a capacity of each filter condenser and hence to reduce the size of the filter condensers.

5) In this example, to the input terminals of bidirectional switching devices 31L, the left side input lines R, S and T are extended in the inward direction toward center line CL. Similarly, to the input terminals of bidirectional switching devices 31R, the right side input lines R, S and T are extended in the inward direction toward center line CL. Therefore, it is possible to reduce the distance or dimension of heat sink 10 in the left and right direction.

6) In this example, filter condensers 821~826 are disposed on the upper side of the busbars. In other words, the bidirectional switching devices 311~316 are disposed on one side of the busbars, and the filter condensers 821~826 are disposed on the other side of the busbars. Therefore, the freedom of layout design of filter condensers 821~826 is increased.

7) In this example, as to the arrangement of busbars 311 and 312 forming output lines P and N and busbars 347 and 348 to snubber condenser 327, the busbars 347 and 348 are disposed between busbars 311 and 312. Therefore, it is possible to reduce the distances including the distances of output lines P and N and the wiring distance to snubber condensers 327.

8) In this example, the busbars 347 and 348 are disposed at the position higher than busbars 311 and 312. Therefore, it is possible to reduce the distances from the diodes of snubber circuits 321~326.

9) In this example, the three filter condensers 821, 822 and 823 are positioned at the apexes of a triangle, respectively. Therefore, it is possible to minimize the wiring distances among the condensers, to reduce the size of power conversion apparatus 3, and to achieve tuning among the condensers.

10) In this example, the three condensers positioned so as to form a triangle are arranged so that one apex of the triangle is directed in the outward direction. Therefore, it is possible to improve the balance of wiring connected with the condensers as compared to the arrangement in which one apex is directed in the inward direction, and to reduce the distance to each of busbars 333, 334 and 335.

11) In this example, the busbars 342 and 343 are inclined with respect to the line connecting the input terminals of bidirectional switching devices 311, 313 and 315. Therefore, it is possible to make the wiring distance equal to the wiring distance of the filter condenser 823 connected between the R phase and T phase, as much as possible. Therefore, it is possible to attain tuning among filter condensers 821, 822 and 823.

12) In this example, the busbars 342 and 343 are provided across the line connecting the input terminals of bidirectional switching devices 311, 313 and 315. Therefore, it is possible to reduce the connection distances of filter condensers 821 and 822 with busbars 333, 334 and 335, and hence it is possible to reduce the size of power conversion apparatus 3.

21 <Other Embodiments>>

According to the present invention, variations and modifications are possible, besides the preceding embodiment. Following is explanation on variation examples according to the present invention. However, there is no intention of limiting the present invention to the above-mentioned embodiment, and following embodiments. Members used in the above-mentioned embodiment are given the same reference numerals and explanation is omitted appropriately.

Figure 4B:
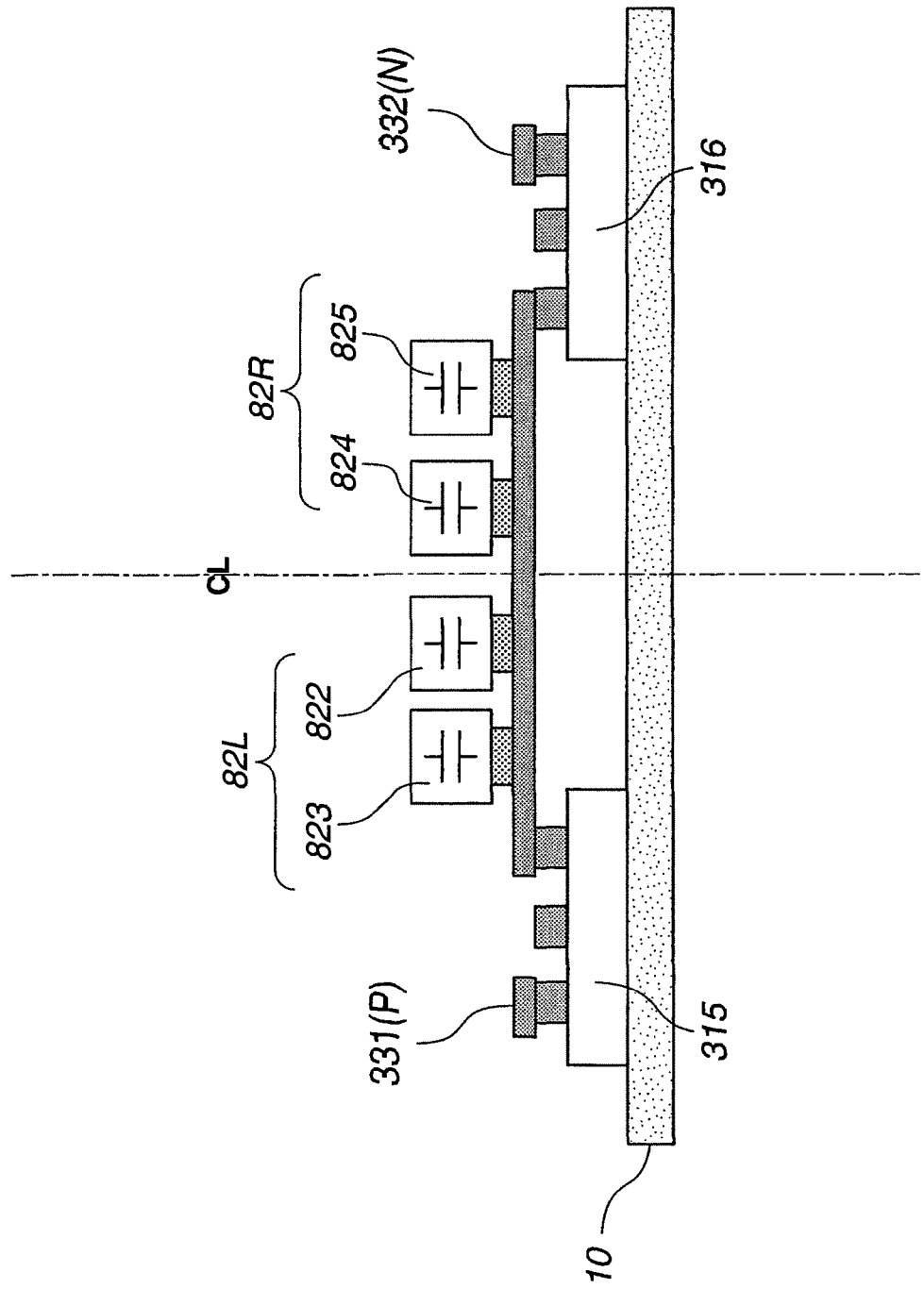
FIG. 4B is a side view of FIG. 4A.

In the above-mentioned embodiment, as shown in FIG. 3, the left side three filter condensers 82L and the right side three filter condensers 82R are disposed, respectively, on the outer sides of bidirectional switching devices 311, 313 and 315, and on the outer side of bidirectional switching devices 312, 314 and 316 with respect to center line CL as the center. However, as shown in FIGS. 4A and 4B, it is possible to place the left side three filter condensers 82L and the right side three filter condensers 82R, between the bidirectional switching devices 311, 313 and 315 on the left side of center line CL and the bidirectional switching devices 312, 314 and 316 on the right side of center line CL.

Moreover, in the above-mentioned embodiment, as shown in FIG. 3, the bidirectional switching devices 311, 313 and 315 are disposed on the right side of center line CL, and the bidirectional switching devices 312, 314 and 316 are disposed on the right side of center line CL. However, it is possible to employ an arrangement in which, as shown in FIG. 5, the bidirectional switching devices 311, 313 and 315 and the bidirectional switching devices 312, 314 and 316 are disposed along the center line CL.

Figure 6:
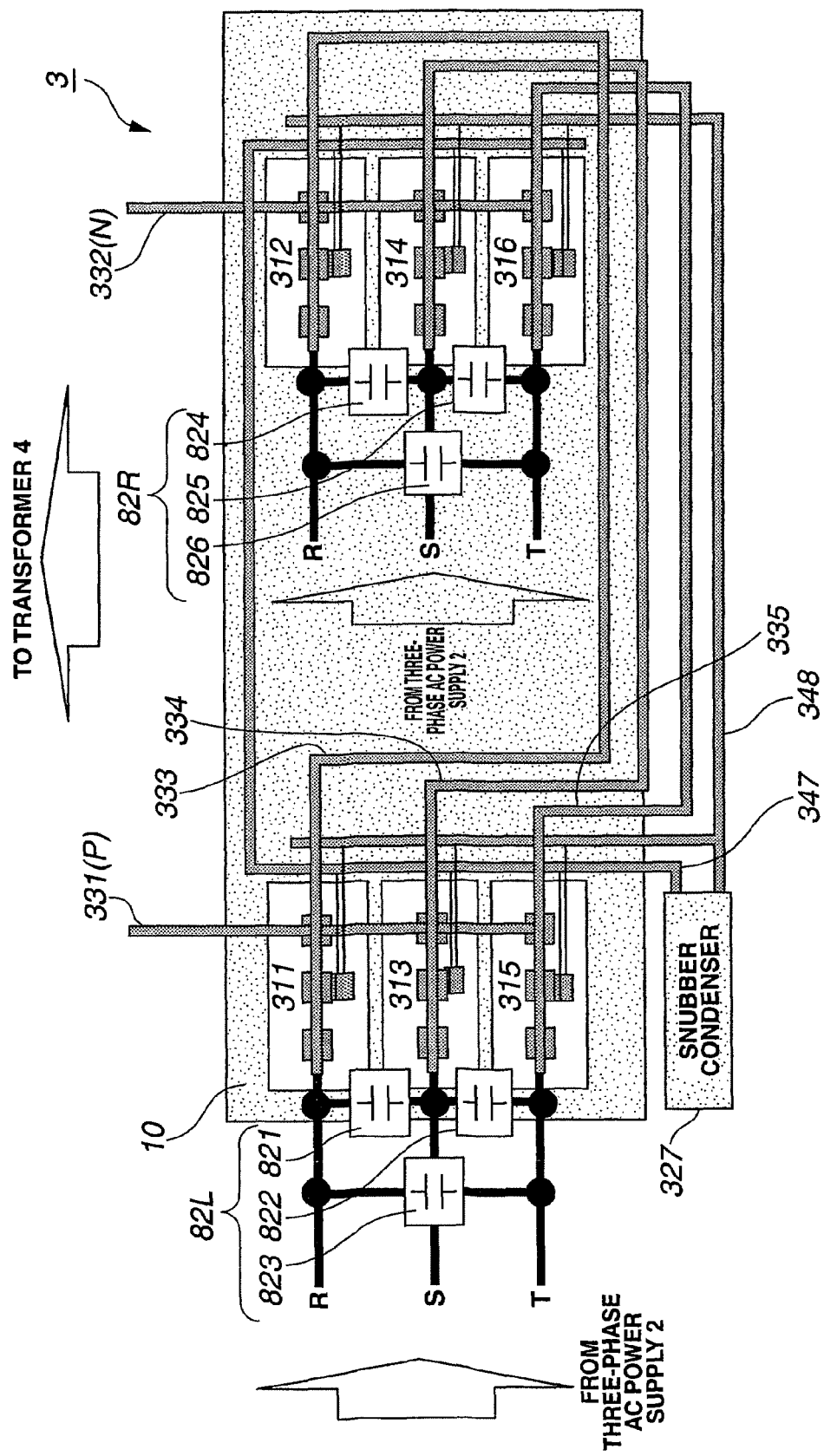
FIG. 6 is a view showing still another layout of the IGBTs and filter condensers shown in FIG. 3, in a plan view.

In the above-mentioned embodiment, as shown in FIG. 3, the three bidirectional switching devices 311, 313 and 315 are disposed on the left side of center line CL, the three bidirectional switching devices 312, 314 and 316 are disposed on the right side of center line, and the input terminals and the output terminals of these six bidirectional switching devices 311~316 are arranged symmetrically with respect to center line CL in a manner of line symmetry or reflection symmetry. However, as shown in FIG. 6, it is possible to employ an arrangement in which the three bidirectional switching devices 311, 313 and 315 are disposed on the left side of center line CL, the three bidirectional switching devices 312, 314 and 316 are disposed on the right side of center line, and the input and output terminals of the left side three bidirectional switching devices 311, 313 and 315 and the input and output terminals of the right side bidirectional switching devices 312m 314 and 316 are arranged in the same manner. In this case, the two set of the input lines R, S and T are extended in the same direction (in the rightward direction in the illustrated example) and connected with the input terminals of the respective bidirectional switching devices.

Figure 7:
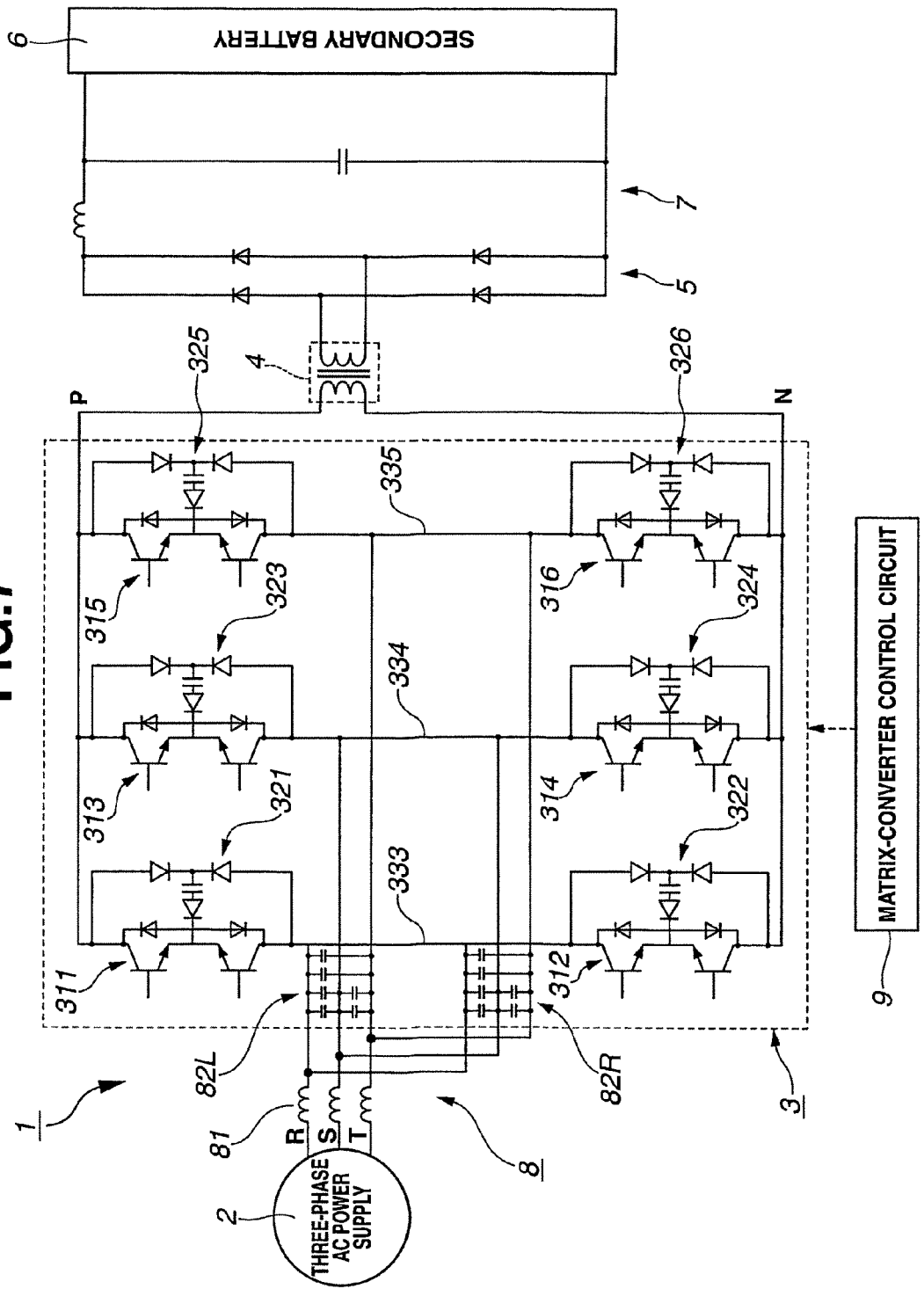
FIG. 7 is an electric circuit diagram showing a power conversion system to which another embodiment of the present invention is applied.

Moreover, in the above-mentioned embodiment, as shown in FIG. 3, filter condensers 821~826 are provided between two phases so that each of the six bidirectional switching devices 311~316 corresponds uniquely to one of the six filter condensers. However, as shown in FIG. 7, it is possible to employ an arrangement in which filter condensers 821~826 are provided between two phases so that each of the six bidirectional switching devices 311~316 corresponds uniquely to a plurality of filter condensers (two of filter condensers in the illustrated example).

Figure 8:
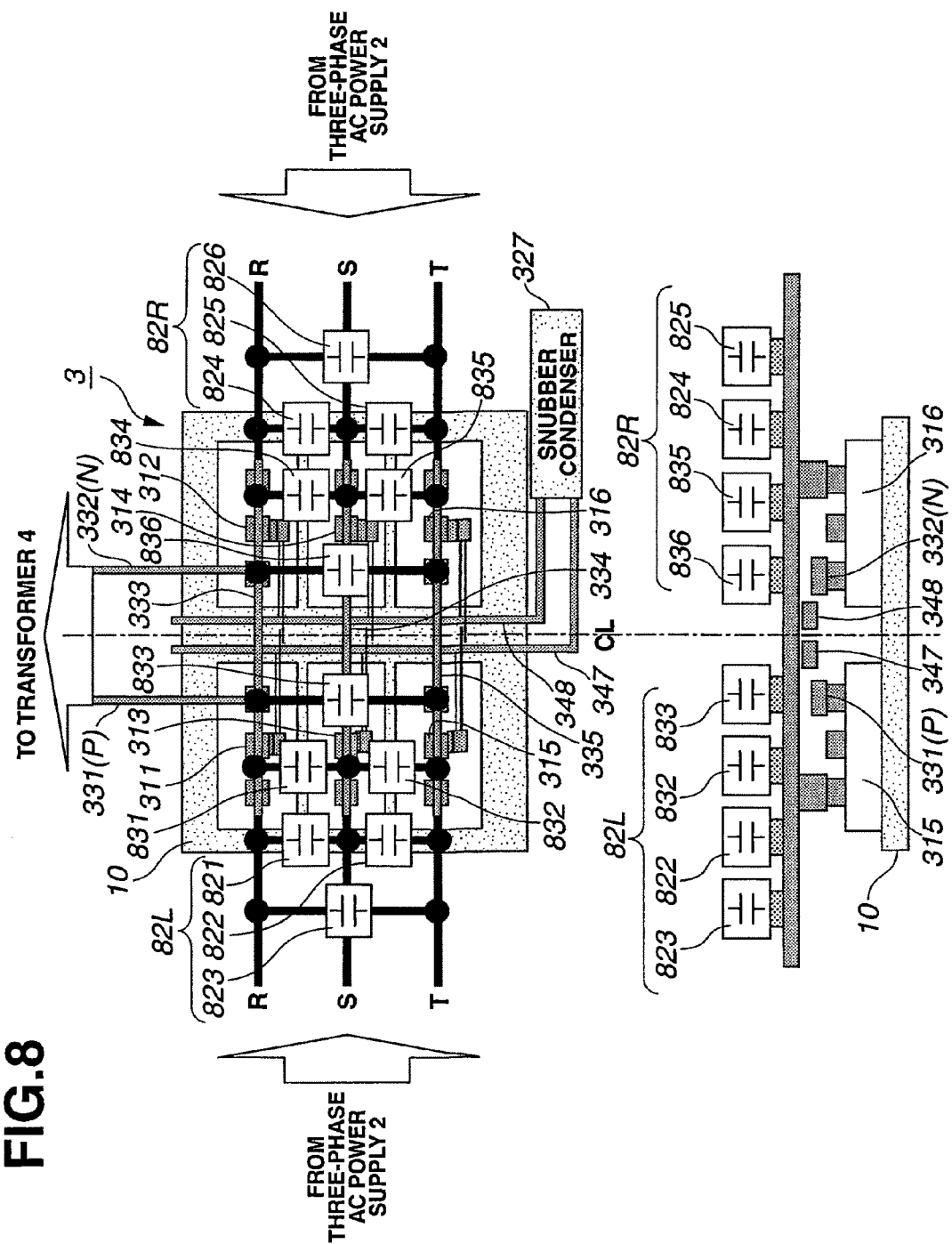
FIG. 8 is a view showing a layout of the IGBTs and filter condensers shown in FIG. 7, in a plan view and a side view.
Figure 9:
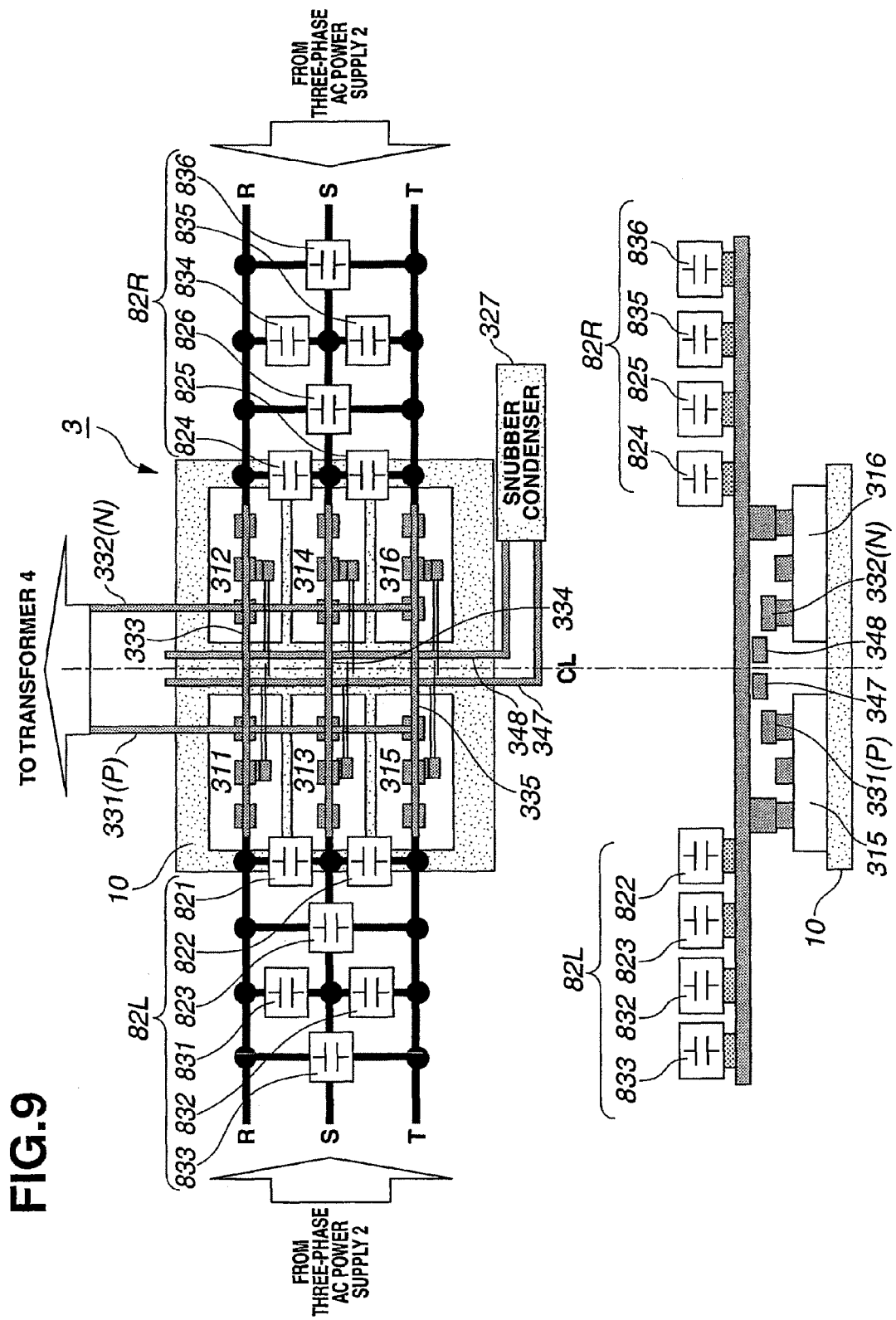
FIG. 9 is a view showing another layout of the IGBTs and filter condensers shown in FIG. 7, in a plan view and a side view.

In this case, the filter condensers may be disposed in a center region of the power conversion apparatus 3 as shown in FIG. 8, or may be disposed on the outer sides of power conversion apparatus 3, as shown in FIG. 9. In the case of the arrangement in which the filter condensers are disposed in the center region of the power conversion apparatus 3 as shown in FIG. 8, it is possible to utilize free space and hence to restrain or reduce the size of power conversion apparatus 3 as much as possible.

The bidirectional switching devices 311, 313 and 315 correspond to a first switching device or element in the claims of the present invention, and the bidirectional switching devices 312, 314 and 316 correspond to a second switching device or element in the claims of the present invention. The power conversion apparatus 3 corresponds to a conversion circuit in the claims of the present invention. The filter condensers 821~826, 831~836 correspond to condensers in the claims of the present invention. The busbars 331 and 332 corresponds to an output line in the claims of the present invention.

The invention claimed is:

1. A power conversion apparatus for converting polyphase ac power directly to ac power, the power conversion apparatus comprising;
   a conversion circuit including a plurality of first switching devices connected, respectively, with phases of the polyphase ac power, and configured to enable electrical switching operation in both directions, and a plurality of second switching devices connected, respectively, with the phases of the polyphase ac power, and configured to enable electrical switching operation in both directions;
   a plurality of input lines connected, respectively, with input terminals of the first switching devices and input terminals of the second switching devices, and
   a first output line connected with output terminals of the first switching devices, and a second output line connected with output terminals of the second switching devices,
   as a spatial arrangement, the output terminals of the first switching devices being arranged in a row and the output terminals of the second switching devices being arranged in a row,
   the first switching devices and the second switching devices arranged in a direction of the rows being arranged side by side with respect to the first and second output lines,
   the first and second output lines being arranged to cross the plurality of input lines in a grade separation,
   wherein the first and second output lines are located between the input terminals of the first switching devices and the input terminals of the second switching devices, the input and output terminals of the first switching devices and the input and output terminals of the second switching devices are formed at a first level, and the first and second output lines are formed at a second level different from the first level, and the first and second output lines at the second level are located between the input terminals of the first switching devices and the input terminals of the second switching devices formed at the first level.

2. The power conversion apparatus as recited in claim 1, further comprising at least one condenser, wherein the at least one condenser is provided between two of the phases of the polyphase ac power corresponding to each of first switching devices and the second switching devices.

3. The power conversion apparatus as recited in claim 2, wherein, between two of the phases, a first condenser is provided near the input terminal of the first switching device and a second condenser is provided near the input terminal of the second switching device.

4. The power conversion apparatus as recited in claim 1, wherein the first output line and the second output line are formed by a pair of busbars extending in parallel with each other.

5. The power conversion apparatus as recited in claim 1, wherein the input lines include a busbar connecting the input terminal of the first switching device and the input terminal of the second switching device, the first output line or a busbar forming the first output line and the busbar of the input lines are arranged to cross each other in a grade separation of an upper level and a lower level.

6. The power conversion apparatus as recited in claim 1, wherein a busbar forming the input lines is disposed above the switching devices, the input terminals of the switching devices are connected with a lower surface of the busbar, and a condenser is disposed on an upper surface of the busbar.

7. The power conversion apparatus as recited in claim 1, wherein each of the first switching devices extends from the input terminal to the output terminal in a first direction intersecting the first output line at an angle, and each of the second switching devices extends from the input terminal to the output terminal in a second direction intersecting the second output line at an angle.

8. The power conversion apparatus as recited in claim 7, wherein the first direction in which the first switching devices extend is substantially perpendicular to the first output line, and the second direction in which the second switching devices extend is substantially perpendicular to the second output line.

9. The power conversion apparatus as recited in claim 1, wherein the first and second output lines extend in an outputting direction between the input terminals of the first switching devices and the input terminals of the second switching devices; and each of the first and second switching devices extends from the input terminal to the output terminal in an inputting direction crossing the outputting direction.

10. The power conversion apparatus as recited in claim 1, wherein the power conversion apparatus further comprises a condenser, and a busbar connected with the condenser is fixed at a level that is higher than the second level and lower than the plurality of input lines.

11. The power conversion apparatus as recited in claim 1, wherein the first output line and the second output line have different conductivity types.

12. The power conversion apparatus as recited in claim 1, wherein the power conversion apparatus further comprises at least one condenser connected with an input line, and as a spatial arrangement, the first switching devices or the second switching devices are located on one side of the input lines, and the at least one condenser is located on the other side of the input lines, wherein the power conversion apparatus further comprises a heat sink, the first switching devices and the second switching devices are mounted on the heat sink, each of the first and second output lines includes an output-side busbar disposed on an upper side of the first switching devices or the second switching devices, each of the input lines includes an input-side busbar disposed on an upper side of the output-side busbars, and the at least one condenser is disposed on an upper side of the input-side busbars such that the input-side busbars, the output-side busbars and the first and second switching devices are located between the at least one condenser and the heat sink.

13. The power conversion apparatus as recited in claim 1, wherein the power conversion apparatus further comprises at least one condenser connected with an input line, and as a spatial arrangement, the first switching devices or the second switching devices are located on one side of the input lines, and the at least one condenser is located on the other side of the input lines, wherein the power conversion apparatus further comprises a heat sink, and the first switching devices and the second switching devices are disposed between the heat sink and the at least one condenser.

14. The power conversion apparatus as recited in claim 13, wherein the first output line and the second output line have different conductivity types.

15. The power conversion apparatus as recited in claim 13, wherein the first switching devices and the second switching devices are mounted on the heat sink and located above the heat sink, the output lines are located above the first switching devices and the second switching devices, the input lines are located above the output lines, and the at least one condenser is disposed above the input lines.

16. The power conversion apparatus as recited in claim 13, wherein the plurality of input lines define one surface at the one side thereof and another surface at the other side thereof, and the first switching devices or the second switching devices are disposed below the one surface of the input lines, and the at least one condenser is disposed on the another surface of the input lines.

17. The power conversion apparatus as recited in claim 13, wherein the first switching devices and the second switching devices are located below the input lines and the at least one condenser is located above the input lines.

\* \* \* \* \*